United States Patent [19]

Sakamoto et al.

[11] Patent Number: 4,984,036
[45] Date of Patent: Jan. 8, 1991

[54] FIELD EFFECT TRANSISTOR WITH MULTIPLE GROOVES

[75] Inventors: Shinichi Sakamoto; Takuji Sonoda, both of Itami, Japan

[73] Assignee: Mitsubishi Denki Kabushiki Kaishi, Japan

[21] Appl. No.: 367,685

[22] Filed: Jun. 19, 1989

[30] Foreign Application Priority Data

Jun. 20, 1988 [JP] Japan ................... 63-153071

[51] Int. Cl.⁵ ........................................... H01L 29/80
[52] U.S. Cl. ........................................ 357/22; 357/15; 357/55
[58] Field of Search ................. 357/55, 22 A, 22 MD, 357/22 I, 22 K, 15, 15 R, 15 A, 15 P, 15 M

[56] References Cited

U.S. PATENT DOCUMENTS

| | | | |
|---|---|---|---|
| 4,425,573 | 1/1984 | Ristow | 357/22 K |
| 4,517,730 | 5/1985 | Meignant | 357/22 K X |
| 4,519,127 | 5/1985 | Arai | 357/22 I X |
| 4,600,932 | 7/1986 | Norris | 357/22 A |
| 4,818,724 | 4/1989 | Cetronio et al. | 357/55 X |

FOREIGN PATENT DOCUMENTS 61-7666 1/1986 Japan ................... 357/22 A

OTHER PUBLICATIONS

Furutsuka et al., "Improvement of the Drain... Recess Structure", IEEE Transactions on Electron Devices, vol. ED-25, No. 6, Jun. 1978, pp. 563-567.
Yamamoto et al., "Light Emission and Burnout... MESFET's", IEEE Transactions on Electron Devices, vol. ED-25, No. 6, Jun. 1978, pp. 567-573.

*Primary Examiner*—William Mintel
*Attorney, Agent, or Firm*—Leydig, Voit & Mayer

[57] ABSTRACT

A field effect transistor has an active layer containing a multi-step recess that becomes narrower as it approaches the substrate. A gate electrode is produced at the deepest portion of the recess section. The transistor may be produced by successively selectively etching the active layer and an overlying semiconductor surface protection film to produce a multi-step configuration recess, depositing a gate electrode at the bottom of the recess, and depositing source and drain electrodes on the active layer.

5 Claims, 5 Drawing Sheets

FIG. 1
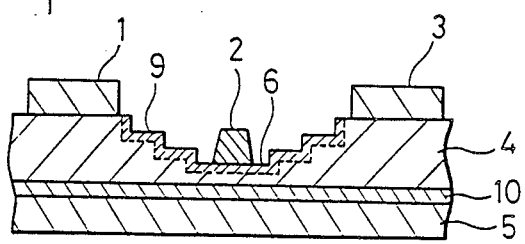
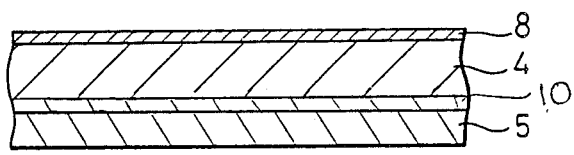
FIG. 2(a)
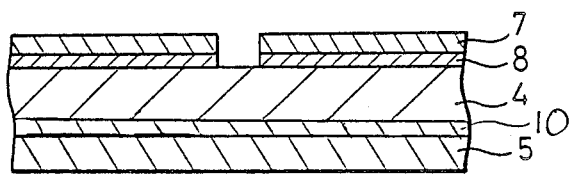
FIG. 2(b)
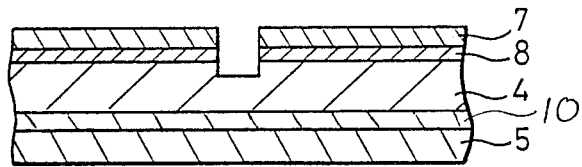
FIG. 2(c)
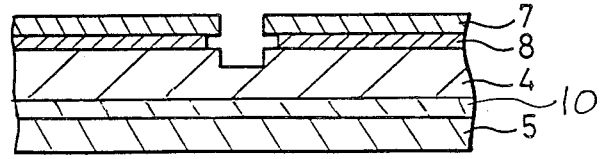
FIG. 2(d)

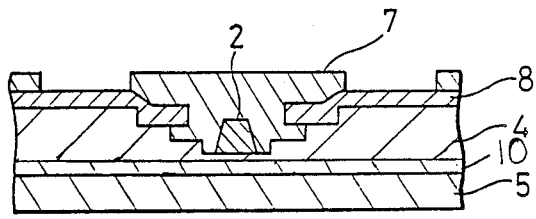
FIG 4(a)
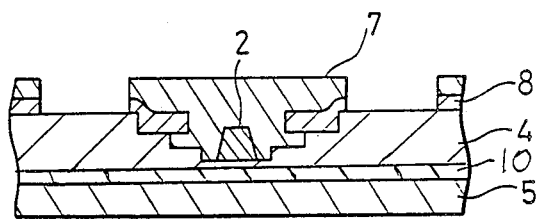
FIG 4(b)
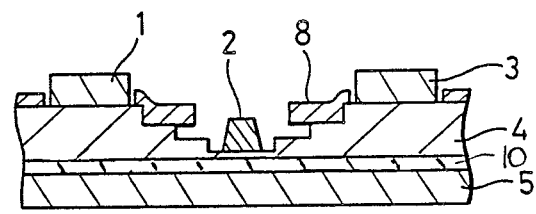
FIG 4(c)
FIG 5 (PRIOR ART)
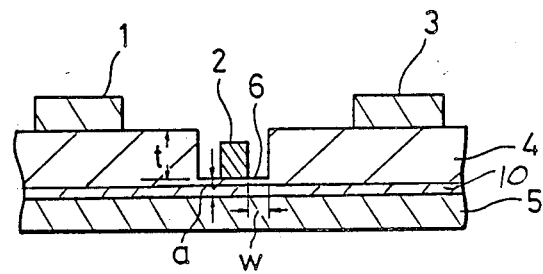

FIELD EFFECT TRANSISTOR WITH MULTIPLE GROOVES

FIELD OF THE INVENTION

The present invention relates to a field effect transistor (FET) or high electron mobility transistor (HEMT) and, more particularly, to such a transistor having a gate recess structure (hereinafter referred to as a recess structure) and a method of producing such a FET and HEMT.

BACKGROUND OF THE INVENTION

FIG. 5 shows a cross-section of a recess structure of a prior art FET. In FIG. 5, an undoped GaAs buffer layer 10 is disposed on a semi-insulating GaAs substrate 5. An active layer 4 is disposed on the GaAs buffer layer 10. A recess groove 6 is produced in the active layer 4. Herein, W represents recess width, t represents the recess groove depth, and a represents the thickness of the active layer below the recess groove. A source electrode 1 and a drain electrode 3 are disposed on the active layer 4 at opposite sides of the recess groove, respectively, and a gate electrode 2 is disposed on the surface of the active layer 4 in the recess groove. The active layer 4 provides a current path between the source electrode 1 and the drain electrode 3. The buffer layer 10 reduces the influence of the substrate 5 on the electrical characteristics of the FET.

In a FET, a recess groove is etched to an active layer thickness a in order to obtain a desired channel current. The gate-drain breakdown voltage depends on the gate recess structure in addition to the active layer structure, such as the carrier concentration and the thickness of the active layer. A wider and shallower gate recess structure shows a higher gate-drain breakdown voltage at a given carrier concentration of the active layer and layer thickness beneath the gate electrode. This wider and shallower recess structure, however, causes a large increase in the gate-source resistance (Rs) which has a deleterious effect on the RF characteristics of the FET. In the prior art FET having such a construction, it is difficult to enhance the gate-drain breakdown voltage without a large increase in gate-source resistance only through the optimization of the recess width and recess depth.

SUMMARY OF THE INVENTION

It is an object of the present invention to provide a FET and HEMT which enhance the gate-drain breakdown voltage while suppressing any increase in the parasitic resistance between the gate and source. The novel FET also increases the drain resistance because of the interface between the active layer and the buffer layer.

Another object of the present invention is to provide a method of producing such a FET and HEMT.

According to the present invention, a recess is produced in the active layer in a multi-step configuration that becomes narrower as it approaches the substrate. A gate electrode is disposed at the innermost portion of the recess. In this recess structure, the electric field between the gate and drain is dispersed. Consequently, both an increase of the gate-drain breakdown voltage and the drain resistance can be achieved. The increase of the drain resistance is due to the reduction of carrier injection into the substrate because of the presence of the undoped buffer layer. Furthermore, since the recess width at the innermost portion of the groove is relatively narrow, the increase of the parasitic resistance between the source and the gate is suppressed.

Other objects and advantages of the present invention will become apparent from the detailed description given hereinafter. It should be understood, however, that the detailed description and specific embodiments are given by way of illustration only since various changes and modifications within the spirit and scope of the invention will become apparent to those skilled in the art from this detailed description.

BRIEF DESCRIPTION OF THE DRAWINGS

FIG. 1 is a diagram showing a cross-sectional view of an FET according to an embodiment of the present invention;

FIGS. 2(a) to 2(i) are diagrams showing a process for producing the device of FIG. 1;

FIGS. 4(a) to 4(c) are diagrams showing process steps for producing the source/drain electrodes of the device of FIG. 1; and FIG. 5 is a diagram showing a cross-sectional view of an FET according to the prior art.

DETAILED DESCRIPTION OF THE PREFERRED EMBODIMENTS

Figure 2E:
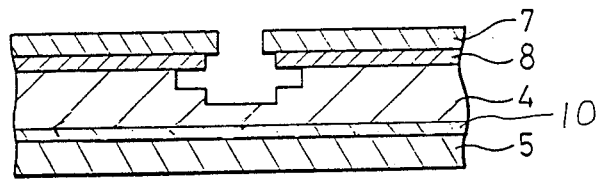

FIG. 1 shows a cross-sectional view of an FET according to an embodiment of the present invention. Elements in FIG. 1 corresponding to elements in FIG. 5 are given the same reference numbers. FIG. 1 shows a surface depletion layer 9 that is present during operation of the FET.

In the FET of the present invention, the recess groove in the active layer 4 has a multi-step configuration that becomes narrower, i.e., shorter in the direction parallel to substrate 5, as it approaches substrate 5. The recess width at its innermost portion where the gate electrode 2 is located is narrower than the recess width of the one-step recess of the prior art device.

By producing a recess in a multi-step configuration that becomes narrower as it approaches the substrate 5, the gate drain breakdown voltage is enhanced and the electric field concentration between the gate and drain is dispersed, i.e., spread out, compared to the prior art device. Furthermore, since the leakage current at the buffer layer 10, that is, at the interface between the active layer 4 and the substrate 5, is reduced, the drain resistance is increased to enhance the RF characteristics of the FET. In addition, an increase in the parasitic resistance can be suppressed by making the recess width narrower at the deepest portion of the recess, where the gate electrode 2 is located, compared to the width of the one-step recess of the prior art device.

An example of production process flow for producing this device is described with reference to FIGS. 2(a) to 2(i) and FIGS. 4(a) to 4(c). FIGS. 2(a) to 2(i) show process steps up to the production of a gate electrode and FIGS. 4(a) to 4(c) show process steps for producing source/drain electrodes.

Figure 2F:
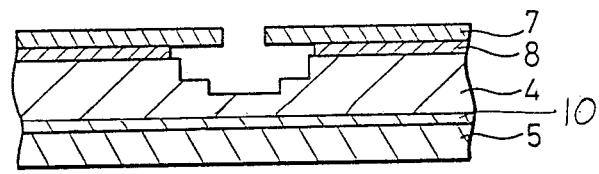
Figure 2G:
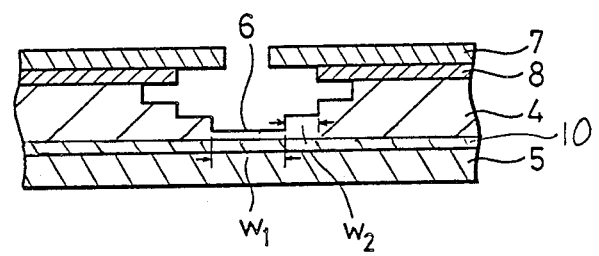
Figure 2H:
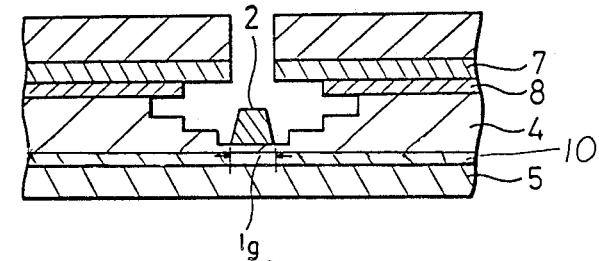
Figure 2I:
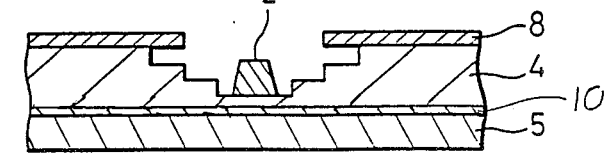

An undoped GaAs buffer layer 10 is grown on semi-insulating GaAs substrate 5. Then, an active layer 4 comprising n-type GaAs is grown on buffer layer 10 to a thickness of about 0.5 micron. A surface protection film 8 comprising, for example, SiN or SiO, is deposited on the active layer 4 to a thickness of about 500 Angstroms (FIG. 2(a)). A resist 7 is deposited on the surface projection layer 8 and a gate aperture is formed in resist 7. The protection film 8 is selectively etched through the gate aperture of film 7 (FIG. 2(b)). Next, the active layer 4 and surface protection film 8 are successively selectively etched, undercutting resist 7 (FIGS. 2 (c) and 2(d)). Then, the active layer 4 is selectively etched, undercutting the protection film 8 (FIG. 2(e)). A series of the selective etchings as described above are repeatedly and successively carried out, alternatively etching the active layer 4 and the protection film 8 to produce a multi-step configuration recess 6 as shown in FIGS. 2(f) and 2(g). Herein, the width of the deepest portion W1 of recess 6 is about 1 micron and the widths of the step portions W2 are larger than (W1-lg)/2. Herein, lg designates gate length. A gate electrode 2 comprising, for example, A1, is deposited on the innermost portion of the recess 6 using masking, metal evaporation, and lift-off steps followed by an annealing step (FIGS. 2(h) and 2(i)). The gate electrode forms a Schottky barrier with the active layer 4.

Thereafter, as shown in FIGS. 4(a) to 4(c), a source electrode 1 and drain electrode 3, each comprising, for example, AuGe/Ni/Au, are deposited on the active layer 4, thereby completing the FET shown in FIG. 1.

Another production process flow is described with reference to FIGS. 3(a) to 3(h).

Figure 3A:
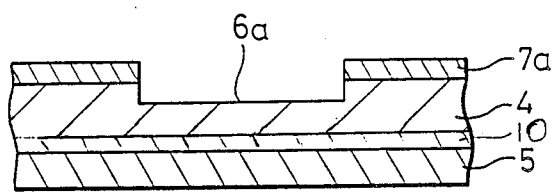
FIGS. 3(a) to 3(h) are diagrams showing process steps for producing the device of FIG. 1.
Figure 3B:
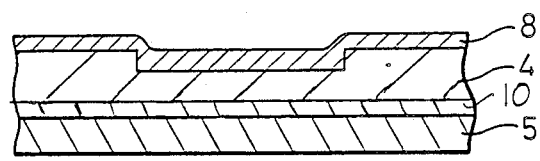
Figure 3C:
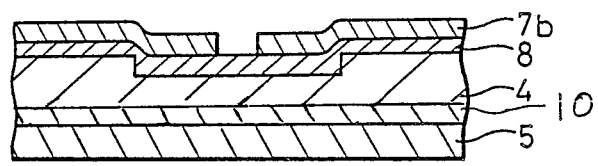
Figure 3D:
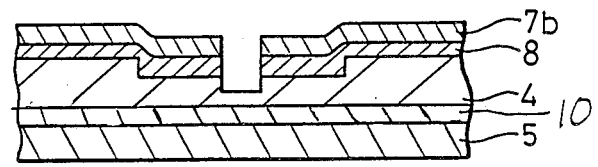
Figure 3E:
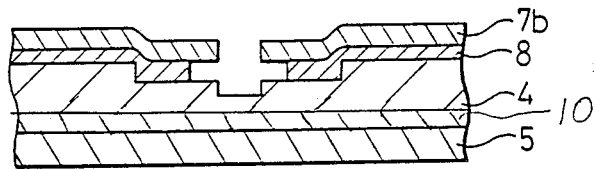
Figure 3F:
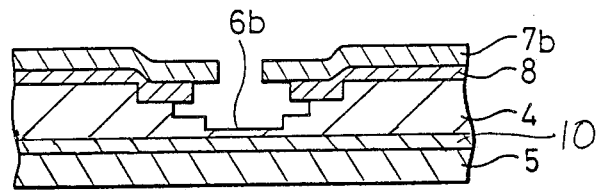
Figure 3G:
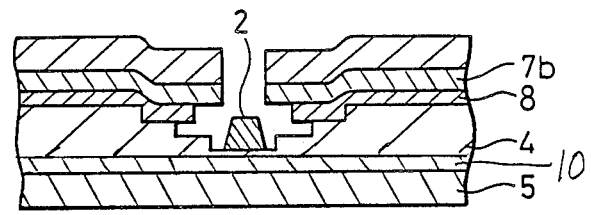
Figure 3H:
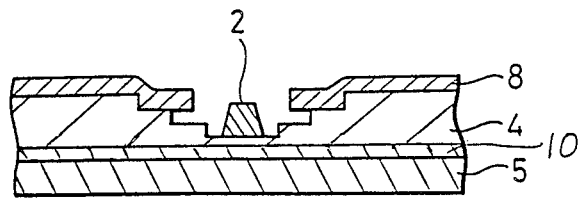

A recess 6a about 2 to 3 microns wide is formed in the active layer 4 with a resist 7a having a recess aperture pattern (FIG. 3(a)). Next, the resist 7a is removed and the entire surface is covered by the surface protection film 8 (FIG. 3(b)). A gate pattern aperture is produced in resist 7b (FIG. 3(c)). The surface protection film 8 is selectively etched to form a gate aperture pattern. The active layer 4 is selectively etched through the gate aperture (FIG. 3(d)). Thereafter, the surface protection film 8 is again selectively etched, undercutting resist 7b (FIG. 3(e)). Then, the active layer 4 is selectively etched, undercutting protection layer 8, thereby producing a multi-step configuration recess (FIG. 3(f)). A gate electrode metal 2 is deposited on the deepest portion of recess 6b by masking, metal evaporation, and lift-off steps followed by annealing (FIGS. 3(g) and 3(h)). The gate electrode 2 forms a Schottky barrier with the active layer 4.

Thereafter, as shown in FIGS. 4(a) to 4(c), the source electrode 1 and drain electrode 3 are produced on the active layer 4, thereby completing the FET shown in FIG. 1.

In the production process steps of FIGS. 2(a) to 2(i), because a multi-step recess structure is obtained by using the resist of the gate pattern 7, an increase in the number of etching steps by the active layer 4 gradually broadens the recess width W1 of the deepest portion of the recess 6. That width exceeds the width of the aperture in the resist 7.

In the production process shown in FIGS. 3(a) to 3(h), however, since the etching of the active layer 4 is carried out using the aperture in the resist 7b, the recess 6a has a predetermined width. Therefore, the width of the recess 6b at the deepest portion can be narrower than that at the deepest portion of the recess produced in the production process of FIGS. 2(a) to 2(i).

While in the above-illustrated embodiment a GaAs FET is described, the present invention may be applied to a high electron mobility transistor (HEMT). In a HEMT, a heterojunction comprising semiconductor layers of different electron affinities is produced by employing one semiconductor for the active layer 4 and a different semiconductor for the substrate 5 and buffer layer 10, e.g., AlGaAs and GaAs, respectively. The invention may also be applied to other FETs formed of other semiconductors, such as silicon, with the same beneficial results described above.

As is evident from the foregoing description, according to the present invention, the recess has a multi-step configuration that becomes narrower as it approaches the substrate and a gate electrode is produced at the deepest portion of the recess. In this recess structure, the electric field between the gate and drain is dispersed. Consequently, both an increase of the gate-drain breakdown voltage and the drain resistance can be achieved. The increase of the drain resistance is due to the reduction of carrier injection between the substrate and the active layer because of the intervening undoped buffer layer. Furthermore, since the width of the recess at the deepest portion from the surface of the active layer is relatively narrow, the increase of the parasitic resistance between the source and the gate is suppressed.

We claim:

1. A transistor including a semiconductor substrate, a doped, active semiconductor layer supported by said semiconductor substrate, a source electrode, a gate electrode, and a drain electrode disposed on said active semiconductor layer, said gate electrode being disposed between said source and drain electrodes for controlling current flow through said active layer between said source and drain electrodes, said active layer including a recess configuration including at least three steps that becomes narrower at each step as the recess approaches said substrate, wherein said gate electrode is disposed on said active layer in the portion of the recess closest to said substrate.

2. The transistor of claim 1 wherein said substrate is semi-insulating GaAs.

3. The transistor of claim 1 including an undoped semiconductor buffer layer interposed between said substrate and said active layer adjacent to said active layer.

4. The transistor of claim 3 wherein said active semiconductor layer and said semiconductor buffer layer comprise different semiconductors, thereby forming a heterojunction, whereby said transistor is a high electron mobility transistor.

5. The transistor of claim 1 wherein said gate electrode forms a Schottky barrier with said active layer.

* * * * *